(12) United States Patent
Douskey et al.

(10) Patent No.: US 10,345,380 B1
(45) Date of Patent: *Jul. 9, 2019

(54) IMPLEMENTING OVER-MASKING REMOVAL IN AN ON PRODUCT MULTIPLE INPUT SIGNATURE REGISTER (OPMISR) TEST DUE TO COMMON CHANNEL MASK SCAN REGISTERS (CMSR) LOADING

(71) Applicant: International Business Machines Corporation, Armonk, NY (US)

(72) Inventors: Steven M. Douskey, Rochester, MN (US); Matthew B. Schallhorn, Greensboro, NC (US); Mary P. Kusko, Hopewell Junction, NY (US); Amanda R. Kaufer, Rochester, MN (US); Michael J. Hamilton, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/886,993

(22) Filed: Feb. 2, 2018

(51) Int. Cl.
*G01R 31/317* (2006.01)
*G01R 31/3185* (2006.01)

(52) U.S. Cl.
CPC ........ *G01R 31/318541* (2013.01); *G01R 31/31704* (2013.01); *G01R 31/318552* (2013.01)

(58) Field of Classification Search
CPC .... G01R 31/318541; G01R 31/318552; G01R 31/31704; G01R 31/3177; G01R 31/318544; G01R 31/3172; G06F 17/505
See application file for complete search history.

(56) References Cited

U.S. PATENT DOCUMENTS

| 7,487,420 | B2 | 2/2009 | Keller |
| 7,509,551 | B2 | 3/2009 | Koenemann et al. |
| 7,823,034 | B2 | 10/2010 | Wohl et al. |

(Continued)

FOREIGN PATENT DOCUMENTS

EP 1491906 A1 12/2004

OTHER PUBLICATIONS

S. Ohtake and D. Shimazu, "An approach to LFSR-based X-masking for built-in self-test," 2017 18th IEEE Latin American Test Symposium (LATS), Bogota, 2017, pp. 1-4.*

(Continued)

*Primary Examiner* — Cynthia Britt
(74) *Attorney, Agent, or Firm* — Joan Pennington

(57) ABSTRACT

A method and circuit are provided for implementing enhanced scan data testing with over masking removal in an on product multiple input signature register plus (OPMISR+) test due to common Channel Mask Scan Registers (CMSRs) loading, and a design structure on which the subject circuit resides. An OPMISR plus satellite includes a multiple input signature register (MISR) for data collection and a plurality of associated scan channels. A common Channel Mask Scan Registers (CMSR) logic is used with the multiple input signature register (MISR). Unique CMSR data is loaded into at least one OPMISR plus satellite for implementing enhanced scan data testing. Scan pausing is used to reduce the amount of CMSR scan load data by loading the unique CMSR data only when needed.

20 Claims, 13 Drawing Sheets

(56) References Cited

U.S. PATENT DOCUMENTS

| | | | |
|---|---|---|---|
| 8,006,150 B2* | 8/2011 | Sinanoglu | G01R 31/318547 714/726 |
| 8,086,923 B2 | 12/2011 | Cheng et al. | |
| 8,166,359 B2 | 4/2012 | Rajski et al. | |
| 9,355,203 B2 | 5/2016 | Douskey et al. | |
| 2009/0300446 A1* | 12/2009 | Rajski | G01R 31/318547 714/726 |
| 2012/0278672 A1* | 11/2012 | Sinanoglu | G01R 31/318547 714/726 |

OTHER PUBLICATIONS

J. Kang, N. A. Touba and J. Yang, "Reducing control bit overhead for X-masking/X-canceling hybrid architecture via pattern partitioning," 2016 53nd ACM/EDAC/IEEE Design Automation Conference (DAC), Austin, TX, 2016, pp. 1-6.*

A. A. Bawa, M. T. Rab and N. A. Touba, "Using partial masking in X-chains to increase output compaction for an X-canceling MISR," 2012 IEEE International Symposium on Defect and Fault Tolerance in VLSI and Nanotechnology Systems (DFT), Austin, TX, 2012, pp. 19-24.*

S. Kim, J. Chung and J. Yang, "Mitigating Observability Loss of Toggle-BasedX-Masking via Scan Chain Partitioning," in IEEE Transactions on Computers, vol. 67, No. 8, pp. 1184-1192, Aug. 1, 2018.*

O. Sinanoglu, "Toggle-Based Masking Scheme for Clustered Unknown Response Bits," 2011 Sixteenth IEEE European Test Symposium, Trondheim, 2011, pp. 105-110.*

B. Keller, "Encounter test OPMISR/sup +/ on-chip compression," IEEE International Conference on Test, 2005., Austin, TX, 2005, pp. 2 pp. 1287.*

C. Barnhart, V. Brunkhorst, F. Distler, O. Farnsworth, B. Keller and B. Koenemann, "OPMISR: the foundation for compressed ATPG vectors," Proceedings International Test Conference 2001 (Cat. No. 01CH37260), Baltimore, MD, USA, 2001, pp. 748-757.*

Vivek Chickermane, Brian Foutz and Brion Keller, "Channel Masking Synthesis for Efficient On-Chip Test Compression" ITC International Test Conference, Paper 15.3, pp. 452-1462, 2004.

Nodari Sitchinava, Samintha Samaranayake, Rohit Kapur, Emil Gizdarski, Frederic Neuveux and T.W. Williams, "Changing the Scan Enable during Shift" Proceedings of the 22nd IEEE VLSI Test Symposium, pp. 1-6, VTS 2004.

Amit R Pandey and Janak H Patel, "Reconfiguration Technique for Reducing Test Time and Test Data Volume in Illinois Scan Architecture Based Designs" Proceedings of the 20th IEEE VLSI Test Symposium, pp. 1-7, VTS 2002.

Appendix P List of Patents and Patent Applications Treated as Related Feb. 6, 2019.

* cited by examiner

230

| B0 | B1 | FUNCTION |
|---|---|---|
| 0 | 0 | NO MASKING (MISR ENABLED) |
| 0 | 1 | MASK USING REGISTER0 (MISR ENABLED) |
| 1 | 0 | MASK USING REGISTER1 (MISR ENABLED) |
| 1 | 1 | GLOBAL MISR MASK ALL CHANNELS |

| 302 | 304 |
|---|---|
| A1 | B1 |
| A2 | B2 |
| A3 | 0 |
| 0 | B4 |
| 0 | 0 |
| A6 | 0 |
| 0 | B7 |
| 0 | 0 |

| 302 | 304 |
|---|---|
| A1/B1 | A1/B1 |
| A2/B2 | A2/B2 |
| A3 | A3 |
| B4 | B4 |
| 0 | 0 |
| A6 | A6 |
| B7 | B7 |
| 0 | 0 |

| 502 | 504 |
|---|---|
| A | A1 |
|  | A2 |
|  | A3 |
| B | B1 |
|  | B2 |
| A/B | 0 |
|  | B4 |
| A/B | 0 |
| A | A6 |
| A/B | 0 |
| B | B7 |
| A/B | 0 |

| 602 | 604 | 606 |
|---|---|---|
| A1 | B1 | 0 |
| A2 | B2 | 0 |
| 0 | B3 | 0 |
| 0 | B4 | 0 |
| A5 | 0 | 0 |
| A6 | 0 | 0 |
| 0 | 0 | 0 |
| 0 | 0 | 0 |
| A9 | B9 | C9 |
| A10 | B10 | C10 |
| 0 | B11 | C11 |
| 0 | B12 | C12 |
| A13 | 0 | C13 |
| A14 | 0 | C14 |
| 0 | 0 | C15 |
| 0 | 0 | C16 |

| 612 | 614 | 616 |
|---|---|---|
| A1/B1 | A1/B1 | A1/B1 |
| A2/B2 | A2/B2 | A2/B2 |
| B3 | B3 | B3 |
| B4 | B4 | B4 |
| A5 | A5 | A5 |
| A6 | A6 | A6 |
| 0 | 0 | 0 |
| 0 | 0 | 0 |
| A1/B1/C1 | A1/B1/C1 | A1/B1/C1 |
| A2/B2/C2 | A2/B2/C2 | A2/B2/C2 |
| B1/C1 | B1/C1 | B1/C1 |
| B2/C2 | B2/C2 | B2/C2 |
| A1/C1 | A1/C1 | A1/C1 |
| A2/C2 | A2/C2 | A2/C2 |
| C1 | C1 | C1 |
| C2 | C2 | C2 |

| 702 | 704 |
|---|---|
| A | A1 |
|  | A2 |
| B | B1 |
|  | B2 |
|  | B3 |
|  | B4 |
| A/B/C | 0 |
|  | 0 |
| A | A5 |
|  | A6 |
| A/B/C | 0 |
|  | 0 |
| A | A9 |
|  | A10 |
| B | B9 |
|  | B10 |
|  | B11 |
|  | B12 |
| A/B/C | 0 |
|  | 0 |
| A | A13 |
|  | A14 |
| A/B/C | 0 |
|  | 0 |
| C | C9 |
|  | C10 |
|  | C11 |
|  | C12 |
|  | C13 |
|  | C14 |
|  | C15 |
|  | C16 |

FIG. 7

IMPLEMENTING OVER-MASKING REMOVAL IN AN ON PRODUCT MULTIPLE INPUT SIGNATURE REGISTER (OPMISR) TEST DUE TO COMMON CHANNEL MASK SCAN REGISTERS (CMSR) LOADING

FIELD OF THE INVENTION

The present invention relates generally to the data processing field, and more particularly, relates to a method and circuit for implementing enhanced scan data testing with over masking removal in an on product multiple input signature register plus (OPMISR+) test due to common Channel Mask Scan Registers (CMSR) loading, and a design structure on which the subject circuit resides.

DESCRIPTION OF THE RELATED ART

Circuits often are prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. In typical scan pattern based tests, chips are tested by scanning data into every latch in the design through a narrow, usually 32-bit wide, scan-in port and triggering functional clock pulses. Then, data is scanned out through another narrow, usually 32-bit wide, scan-out port, where it is compared to pre-computed values.

There are a few different ways that this scan-in bus can be delivered to all parts of a chip. In the naïve approach, each of the 32 scan chains contain 1/32nd of the total logic of the chip. This works and allows for the most unique data in each scan cycle, but it takes a lot of data volume to make this possible. Plus, tests tend to be quite long and require a lot of data since it requires that the entire chip is scanned in and out in each test iteration.

One method to increase efficiency is to deliver scan data in parallel to many parts of the chip at once, usually through a fan-out network feeding to many channels, which in turn feed a section of logic on the chip, and have that accompanied with a Multiple Input Signature Register (MISR) for on-chip data compression. This technique is called On Product Multiple Input Signature Register (OPMISR+). This also includes a method for masking specific data in the channels, which can be used to prevent possible corruption of the MISR. For example, such a method for masking specific data in the channels was developed and is supported by Cadence Corporation.

In large complex processors there can be more than one MISR. As used in the following description and claim, an OPMISR+ satellite includes one MISR and the channels above the MISR. With common Channel Mask Scan Registers (CMSRs) scanned into multiple OPMISR+ satellites and a global pair of Channel Mask Enable (CME) signals, typically there is over masking in OPMISR+ test patterns, which reduces the effectiveness of the patterns. It can be more practical to have several of these OPMISR+ satellites spread throughout the chip.

Using Multiple Scan Sections (MSS) for the CMSR scan loading can send unique CMSR data to each satellite one at a time, but this can add a significant amount of scan data and time.

Another solution is to use Logic Built in Self Test (LBIST), which feeds scan-in data from a Pseudo-Random Pattern Generator (PRPG) instead of from tester pins. By doing this, no scan-in data is needed, only an initial seed. However, a PRPG can only create a limited set of patterns based on the structure and the feedback of the PRPG. The PRPG can be reseeded or the feedback equation can be changed in order to target more or different faults; however, it is difficult to do this with fault targeting in a deterministic way.

SUMMARY OF THE INVENTION

Principal aspects of the present invention are to provide a method and circuit for implementing enhanced scan data testing with over masking removal in an on product multiple input signature register plus (OPMISR+) test due to common Channel Mask Scan Registers (CMSR) scan data loading, and a design structure on which the subject circuit resides. Other important aspects of the present invention are to provide such method and circuit substantially without negative effects and that overcome many of the disadvantages of prior art arrangements.

In brief, a method and circuit are provided for implementing enhanced scan data testing with over masking removal in an on product multiple input signature register plus (OPMISR+) test due to common Channel Mask Scan Registers (CMSRs) loading, and a design structure on which the subject circuit resides. A common Channel Mask Scan Registers (CMSR) logic is used with a multiple input signature register (MISR). Unique CMSR data is loaded into at least one OPMISR plus satellite for implementing enhanced scan data testing. Scan pausing is used to reduce the amount of CMSR scan load data by loading the unique CMSR data only when needed.

In accordance with features of the invention, enhanced scan data testing is effectively and efficiently implemented with loading unique CMSR data to OPMISR plus satellites only when needed to enable data volume reduction and avoiding over masking.

In accordance with features of the invention, the Channel Mask Scan Registers (CMSRs) logic include two mask latches per MISR bit or Channel Mask Scan Bits and two Channel Mask Enable (CME) signals selectively paused to remove over-masking during unload scan test data.

In accordance with features of the invention, a Pseudo-Random Pattern Generator (PRPG) and weighting provides channel input patterns via a respective multiplexer to a respective associated scan channel used for the OPMISR+ scan data testing.

In accordance with features of the invention, when CMSR data is input for a set of scan sections, if there is no CMSR data that is non-zero, then zero is scanned into all of the CMSR scan sections in parallel. If there is some non-zero CMSR data, then starting at the first bit to be scanned in to each of the CMSR sections, check if any bit in the current scan-in position for any CMSR scan section is non-zero. When the current scan-in position for any CMSR scan section is non-zero, then one CMSR scan section is picked that has non-zero CMSR data to scan in along with any other scan section that has the same data. The satellite selects are set to scan in the data for the CMSR scan sections that have the same data, then 32 bits are scanned in with a single scan clock. The scan in index is incremented for each of the satellites selected. Otherwise if the scan in data for all the CMSR sections was zero, then all scan sections are selected and zero for 32 bits are scanned in with a single scan clock. Next, check if the end of any CMSR scan section has been reached. When the end of any CMSR scan section has been reached, that scan section is removed from the list that can be selected for any future CMSR scans. Then check if there are any CMSR scan sections that need data scanned in. If no, then CMSR scanning is done. If any CMSR scan sections are left, then operations return to check if any bit in the current scan-in position for any CMSR scan section is non-zero, and check the current scan in index of each section to see if the data to scan in is all zeros.

BRIEF DESCRIPTION OF THE DRAWINGS

The present invention together with the above and other objects and advantages may best be understood from the following detailed description of the preferred embodiments of the invention illustrated in the drawings, wherein:

FIGS. 2A and 2B respectively illustrate an example an on product multiple input signature register plus (OPMISR+) test circuit in accordance with preferred embodiments of the invention;

FIGS. 3A, and 3B respectively illustrate example masking needs for each CMSR scan sections A and B, together with actually received scan data masking for the CMSR scan sections A and B when scan load data is shared in an on product multiple input signature register plus (OPMISR+) test circuit;

FIG. 5 illustrate example twelve steps to load correct mask for each CMSR scan sections A and B rather that load both sections always, a select decode allows one or both sections to be loaded at any step, and when both match, both may be selected and loaded together, while when unique only one will be loaded while the other is paused in accordance with preferred embodiments of the invention;

FIGS. 6A and 6B respectively illustrate example masking needs for each CMSR location three scan sections A, B and C, together with actually received scan data masking for the CMSR scan sections A, B and C when all share scan load data in an on product multiple input signature register plus (OPMISR+) test circuit;

FIG. 7 illustrate example thirty-two steps to load correct mask to the original intent shown in the first half of FIGS. 6A and 6B for each CMSR scan sections A, B and C rather that load all sections always, a select decode allows one, two or three sections to be loaded at any step, and when any match they may be selected and loaded together, but when unique only one will be loaded while the others are paused in accordance with preferred embodiments of the invention;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing enhanced scan data testing with over masking removal in an on product multiple input signature register plus (OPMISR+) test due to common Channel Mask Scan Registers (CMSRs) loading, and a design structure on which the subject circuit resides. A common Channel Mask Scan Registers (CMSR) logic is used with a multiple input signature register (MISR). Unique CMSR data is loaded into at least one OPMISR plus satellite for implementing enhanced scan data testing. Scan pausing is used to reduce the amount of CMSR scan load data by loading the unique CMSR data only when needed.

Figure 1:
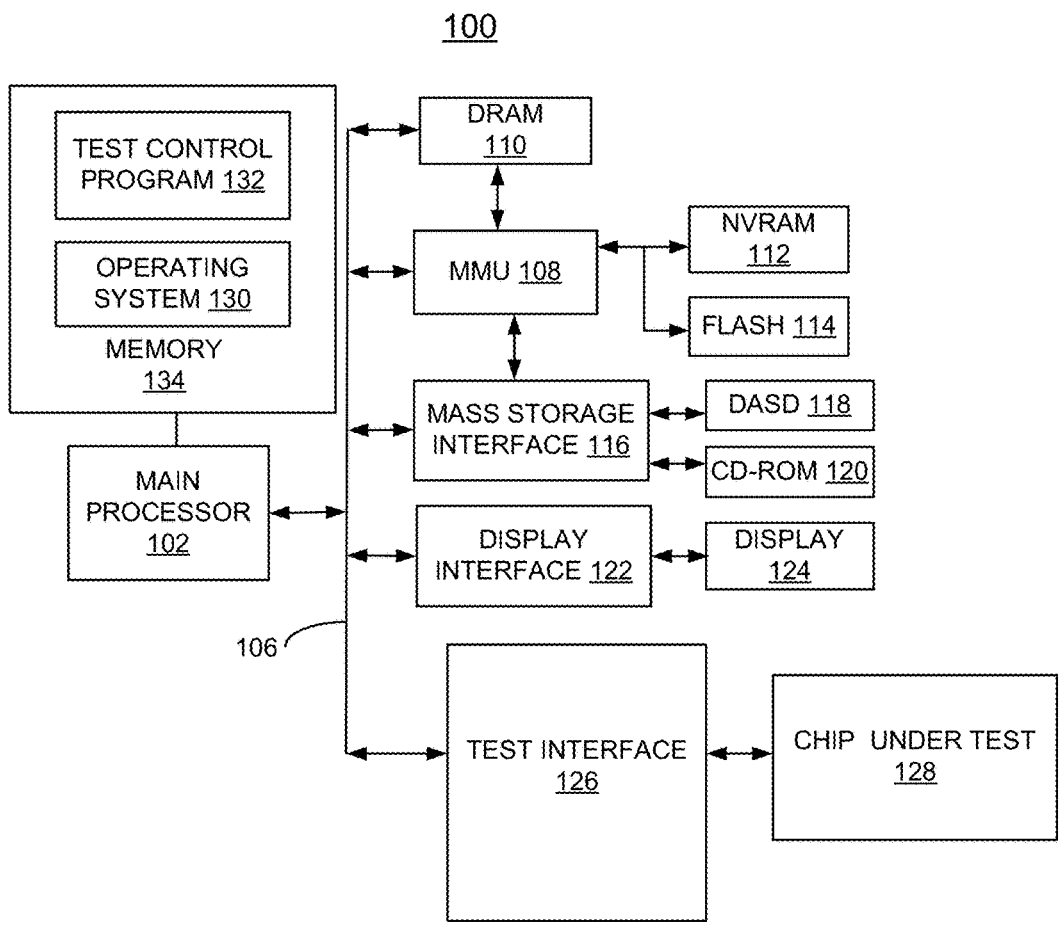
FIG. 1 is a block diagram representation illustrating an exemplary computer test system for implementing enhanced scan data testing with over masking removal in an on product multiple input signature register plus (OPMISR+) test due to common Channel Mask Scan Registers (CMSRs) scan data loading, and a design structure on which the subject circuit resides in accordance with the preferred embodiment.

Having reference now to the drawings, in FIG. 1, there is shown an exemplary computer test system for implementing enhanced scan data testing with over masking removal in an on product multiple input signature register plus (OPMISR+) test due to common Channel Mask Scan Registers (CMSRs) loading generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
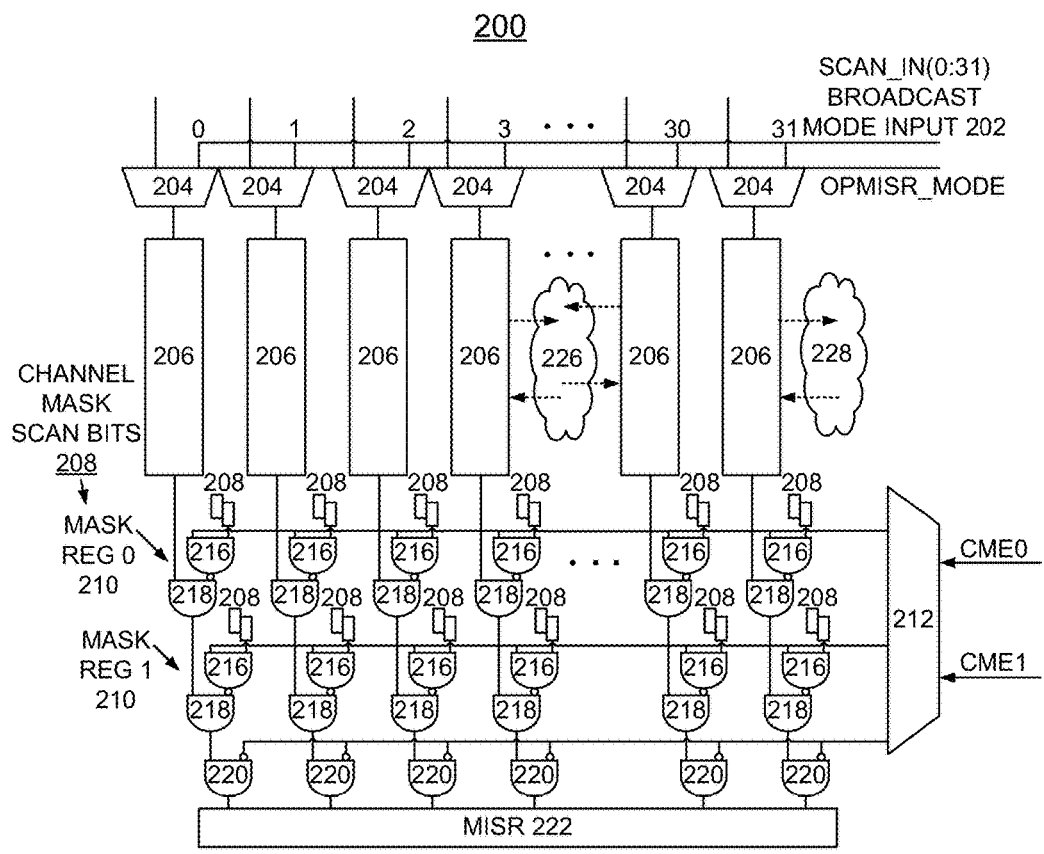

Referring now to FIGS. 2A and 2B, there is shown an example an on product multiple input signature register plus (OPMISR+) test circuit generally designated by the reference character 200 in accordance with preferred embodiments of the invention. The OPMISR plus test circuit 200 provides channel input patterns via a respective multiplexer 204 to a respective associated scan channel 206 used for the OPMISR+ scan data testing. A scan-in (0:31) broadcast mode input 202 is selectively coupled by the respective multiplexer 204 responsive to an OPMISR_MODE control input applied to the multiplexers 204. The OPMISR plus test circuit 200 includes OPMISR+ masking including two mask latches per MISR bit (referred to as Channel Mask Scan Bits 208 in Channel Mask Scan Registers (CMSRs) 0, 1, 210 and two Channel Mask Enable (CME) signals CME0, CME1 applied to CME logic 212. Each of the channel Mask Scan Registers (CMSRs) 0, 1, 210 include a respective pair of AND gates 216, 218 with an inverted output of AND gate 216 applied to AND gate 218. A respective AND gate 220 coupled to an output of AND gate 218 of mask register 1, 210 and an inverted logic output of CME logic 212 couples a respective channel bit position (0:31) to a Multiple Input Signature Register (MISR) 222 for on-chip data compression.

Referring to FIG. 2B, an example CME function table 230 is shown. For example, the CME signals decode to four states of: no masking (B0, B1: 0 0), use mask register 0 (B0, B1: 0 1), use mask register 1 (B0, B1: 1 0), or global MISR mask all channels (B0, B1: 1 1). The masking is applied as the data is unloaded from the respective channels 206 into the MISR 222. When a bit position in a channel is going to shift into the MISR, the global CME signal is set to the desired mask state. For example, if channel 3 needs scan position 28 to be ignored, when bit 28 of the channel is about to be shifted into the MISR during the unload, the CME signals could be set to use mask register 1. The channel 3 mask scan bit in mask register 1 would have previously been set to mask. Other mask bits for other channels may or may not have been set to mask based on needs for the rest of the scan data unload.

As indicated by reference characters 226, 228, there advantageously can be multiple OPMISR+ satellites or OPMISR plus test circuits 200 spread throughout the chip under test. For most efficient scanning and less scan data, the Channel Mask Scan Bits 208 for register 0, 210 and register 1, 210 are scan initialized in parallel and shared across satellites. However this means all satellites have the same mask bits. Additionally, all satellites usually get the same CME information during unload. For the example above, if the first satellite needed bit 4 of the channel mask scan register set and used at the scan position 28 but the second satellite did not, the second satellite would unnecessarily be masked at the same time as the bit in the first register, since both satellites receive the same data for the channel mask scan register. Thus, while it is efficient to share channel mask scan register data, one is left with the problem of over masking. All the channels with their mask bit set will be masked whenever the CME signals say to use that masking, even if only one channel in one satellite needed that bit position masked.

In accordance with features of the invention, to reduce the amount of CMSR scan load data scan pausing is used to load unique CMSR data only when needed. When much of the CMSR data is identical, test time can be reduced. Satellite selection is used to load the unique scan data.

FIGS. 3A, and 3B respectively illustrate example masking needs generally designated by the reference character 300 for each CMSR scan sections A, 302 and B, 304 in FIG. 3A, together with actually received scan data masking generally designated by the reference character 310 for the CMSR scan sections A, 302 and B, 304 in FIG. 3B, when scan load data is shared in an on product multiple input signature register plus (OPMISR+) test circuit 200. In FIG. 3B, the shaded blocks labeled A1/B1 represent required masks that contain extra bits needed for masking that section and the darker shaded blocks labeled B4, and B7 in the CMSR scan section A, 302 and the darker shaded blocks labeled A3, and A6 in the CMSR scan section B, 304 show masks that are loaded when no masking is required at all.

Figure 4A:
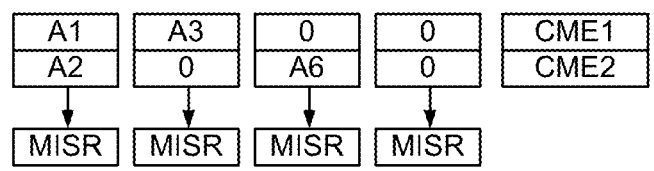
FIGS. 4A, 4B, and 4C, and FIGS. 4D, 4E, and 4F respectively illustrate example masking needs for each CMSR scan unload masking ideally of sections A and B into the MISR in FIGS. 4A, and 4D, together with actually received unload scan data masking for the CMSR scan unload sections A and B into the MISR in FIGS. 4B, and 4E, when scan load data is shared and in FIGS. 4C, and 4F the way the masks are used after the fix restores them to the original intent in accordance with preferred embodiments of the invention.
Figure 4B:
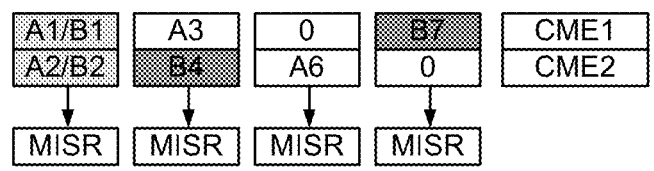
Figure 4C:
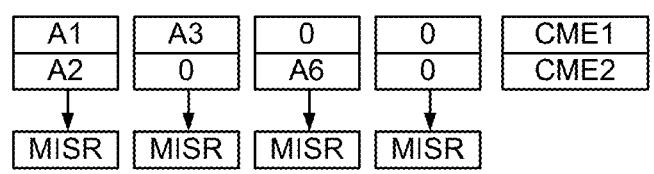
Figure 4D:
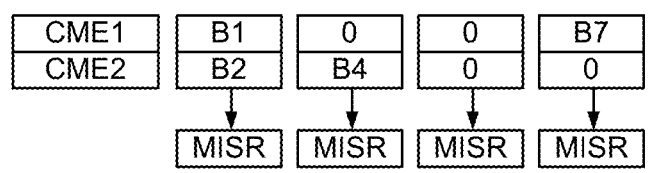
Figure 4E:
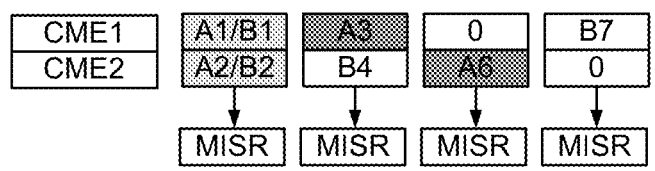
Figure 4F:
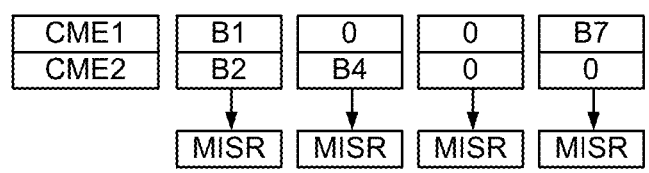

FIGS. 4A, 4B, and 4C, and FIGS. 4D, 4E, and 4F respectively illustrate example masking needs for each CMSR scan unload masking ideally of sections A and B into the MISR generally designated by respective reference characters 400, 430 in FIGS. 4A, and 4D, together with actually received unload scan data masking for the CMSR scan unload sections A and B into the MISR generally designated by respective reference characters 410, 440 in FIGS. 4B, and 4E, when scan load data is shared and generally designated by respective reference characters 420, 450 in FIGS. 4C, and 4F the way the masks are used after the fix restores them to the original intent in accordance with preferred embodiments of the invention. In section A, 410 in FIG. 4B, and in section B, 440 in FIG. 4E, the shaded blocks labeled A1/B1 and A2/B2 represent required masks that contain extra bits needed for masking that section. In section A, 410 in FIG. 4B, the darker shaded blocks labeled B4, B7 and in section B, 440 in FIG. 4E the darker shaded blocks labeled A3, A6 show masks that are loaded when no masking was required at all. In section A, 420 in FIG. 4C, and in section B, 450 in FIG. 4E, the unload section A, 420 and section B, 450, masking after fix restores the respective unload scan data to the original intent in accordance with preferred embodiments of the invention corresponding to the masking ideally as shown in CMSR scan unload masking ideally of sections A and B, 400, 430 in FIGS. 4A, and 4D.

FIG. 5 illustrate example twelve steps generally designated by the reference character 500 to load correct mask generally designated by the reference character 502 for each CMSR scan sections A and B generally designated by the reference character 504 rather that load both sections always, the select decode 502 allows one or both sections 504 to be loaded at any step, and when both match, both may be selected and loaded together, while when unique only one will be loaded while the other is paused in accordance with preferred embodiments of the invention. As shown, with select decode of A, section A is loaded with A1, A2, A3, and A6 while the other section B is paused. With select decode of A/B, both section A and section B are loaded with zero, and with select decode of B, section B is loaded with B1, B2, B4, B7 and while the other section A is paused.

FIGS. 6A and 6B respectively illustrate example masking needs for each CMSR location three scan sections A, B and C, together with actually received scan data masking for the CMSR scan sections A, B and C when all share scan load data in an on product multiple input signature register plus (OPMISR+) test circuit. In FIG. 6A, example masking needs for each CMSR location generally designated by the reference character 600 for three scan sections A, 602, B, 604 and C, 606. In FIG. 6B, example masking are actually loaded in the CMSRs when all 3 share the same load operation for each CMSR location generally designated by the reference character 610 for three scan sections A, 612, B, 614 and C, 616. In FIG. 6B, light shaded blocks respectively labeled A1/B1, A2/B2, A1/B1/C1, B1/C1, and A1/C1 show required masks that contain extra bits needed for masking that section. In FIG. 6B, darker shaded blocks respectively labeled A1/B1, A2/B2, B3, B4, A5, A6, B1/C1, A1/C1, A2/C2, C1, and C2 show masks that are loaded when no masking was required at all.

FIG. 7 illustrate example thirty-two steps generally designated by the reference character 700 to load correct mask to the original intent shown in FIG. 6A for each CMSR scan sections A, B and C rather that load all sections always, a select decode generally designated by the reference character 702 allows one, two or three sections 704 to be loaded at any step, and when any match they may be selected and loaded together, but when unique only one will be loaded while the others are paused in accordance with preferred embodiments of the invention. As shown, with select decode of A, section A is loaded with A1, A2, A5, A6, A9, A10, A13, and A14 while the other sections B and C are paused. With select decode of A/B/C, section A, section B and section C are loaded with zero, and with select decode of B, section B is loaded with B1, B2, B3, B4, B9, B10, B11, and B12 while the other sections A and C are paused. With select decode of C, section C is loaded with C9, C10, C11, C12, C13, C14, C15, and C16 and while the other sections A and B are paused.

Figure 8:
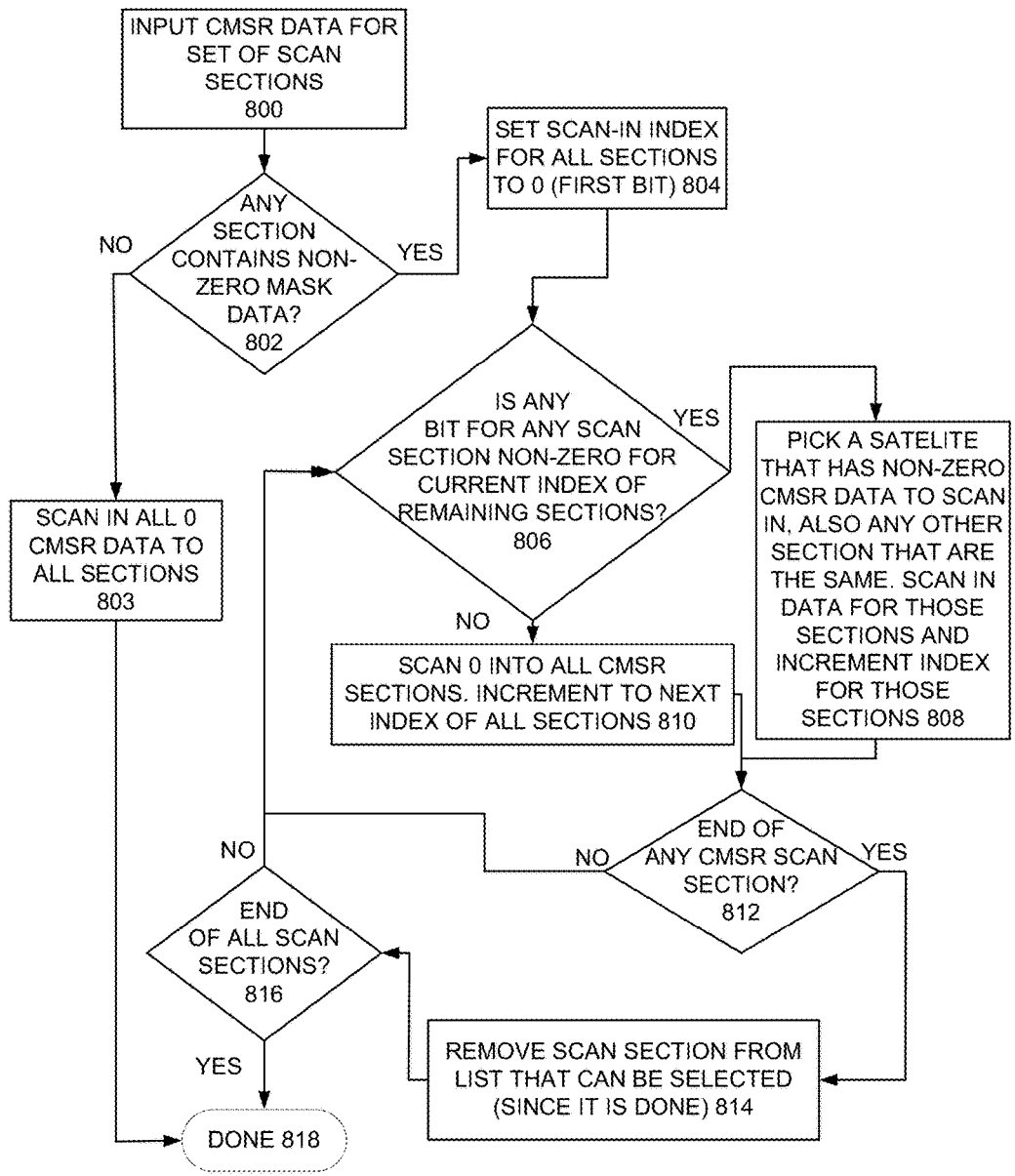
FIG. 8 is a flow chart illustrating example test operations in accordance with the preferred embodiments.

Referring to FIG. 8, there is shown a flow chart illustrating example test operations for enhanced scan data testing with over masking removal in an on product multiple input signature register plus (OPMISR+) test due to common Channel Mask Scan Registers (CMSR) scan data loading in accordance with the preferred embodiments. As shown in a block 800, CMSR data is input for a set of scan sections. Checking if any CMSR scan section contains non-zero mask data is performed as indicated in a decision block 802, where non-zero mask data indicates masking. If there is no CMSR data that is non-zero, then zero is scanned into all of the CMSR scan sections in parallel as shown in a block 803. If there is some non-zero CMSR data, then a scan in index is set to zero for starting at a first bit to be scanned in to each of the CMSR sections as shown in a block 804. Checking is performed if any bit in the current scan-in position for any CMSR scan section is non-zero as indicated in a decision block 806. When the current scan-in position for any CMSR scan section is non-zero, then one CMSR scan section is picked that has non-zero CMSR data to scan in along with any other scan section that has the same data. The satellite selects are set to scan in the data for the CMSR scan sections that have the same data, then one bit is scanned in and the scan-in index is incremented for each of the satellites selected as shown in a block 808. Otherwise when the scan in data for all the CMSR sections is zero, then all scan sections are selected and a zero for one bit is scanned in as shown in a block 810. Next, checking is performed if the end of any CMSR scan section has been reached as indicated in a decision block 812. When the end of a CMSR scan section has been reached, that scan section is removed from the list that can be selected for any future CMSR scans as shown in a block 814. Then checking is performed if there are any CMSR scan sections that need data scanned in as indicated in a decision block 816. If there are no CMSR scan sections that need data scanned in, then CMSR scanning is done as shown in a block 818. If any CMSR scan sections are left, then operations return to decision block 806 to check if any bit in the current scan-in position for any CMSR scan section is non-zero, and continue to check the current scan-in index of each section to see if the data to scan in is all zeros.

Additionally, it should be understood that other methods could be used to analyze the sequences of non-zero data to scan in, to most efficiently arrange the order of what satellites are selected. For example, when multiple sections of non-zero masks exist, a program may look ahead to see if any match, then allow loading of each non-zero section with the intent of aligning these for loading in the same step. While this results in a smaller load, it is likely an insignificant improvement, so unlikely worth the effort.

Figure 9:
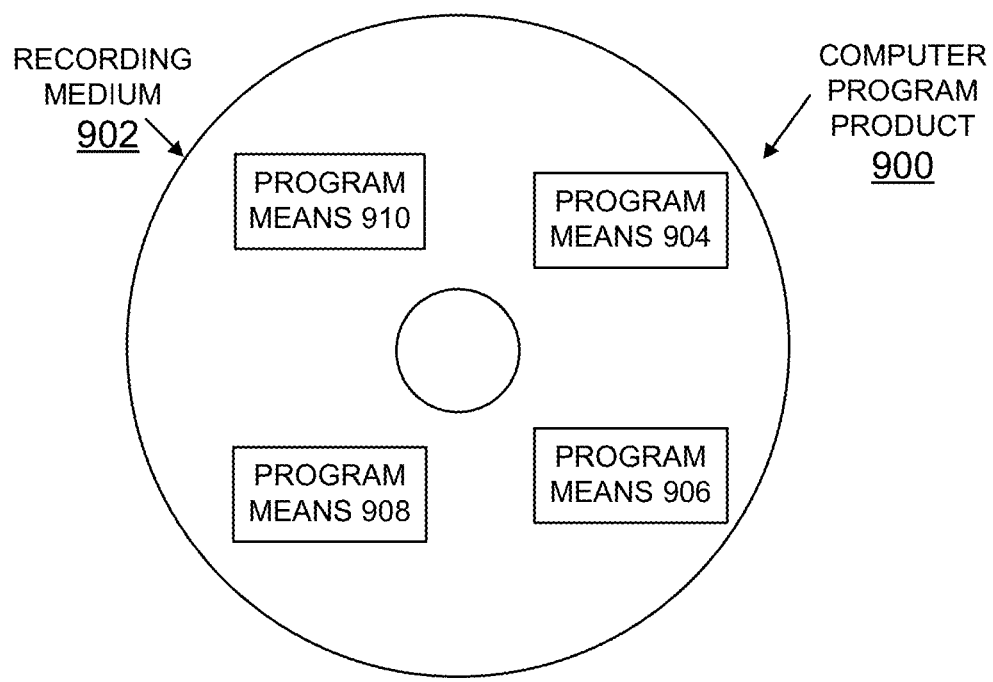
FIG. 9 is a block diagram illustrating a computer program product in accordance with the preferred embodiments.

Referring now to FIG. 9, an article of manufacture or a computer program product 900 of the invention is illustrated. The computer program product 900 includes a recording medium 902, such as, a floppy disk, a high capacity read only memory in the form of an optically read compact disk or CD-ROM, a tape, or another similar computer program product. Recording medium 902 stores program means 904, 906, 908, and 910 on the medium 902 for carrying out the methods for implementing enhanced scan data testing of the preferred embodiment in the system 100 of FIG. 1.

A sequence of program instructions or a logical assembly of one or more interrelated modules defined by the recorded program means 904, 906, 908, and 910, direct the computer system 100 for implementing enhanced scan data testing of the preferred embodiment.

Figure 10:
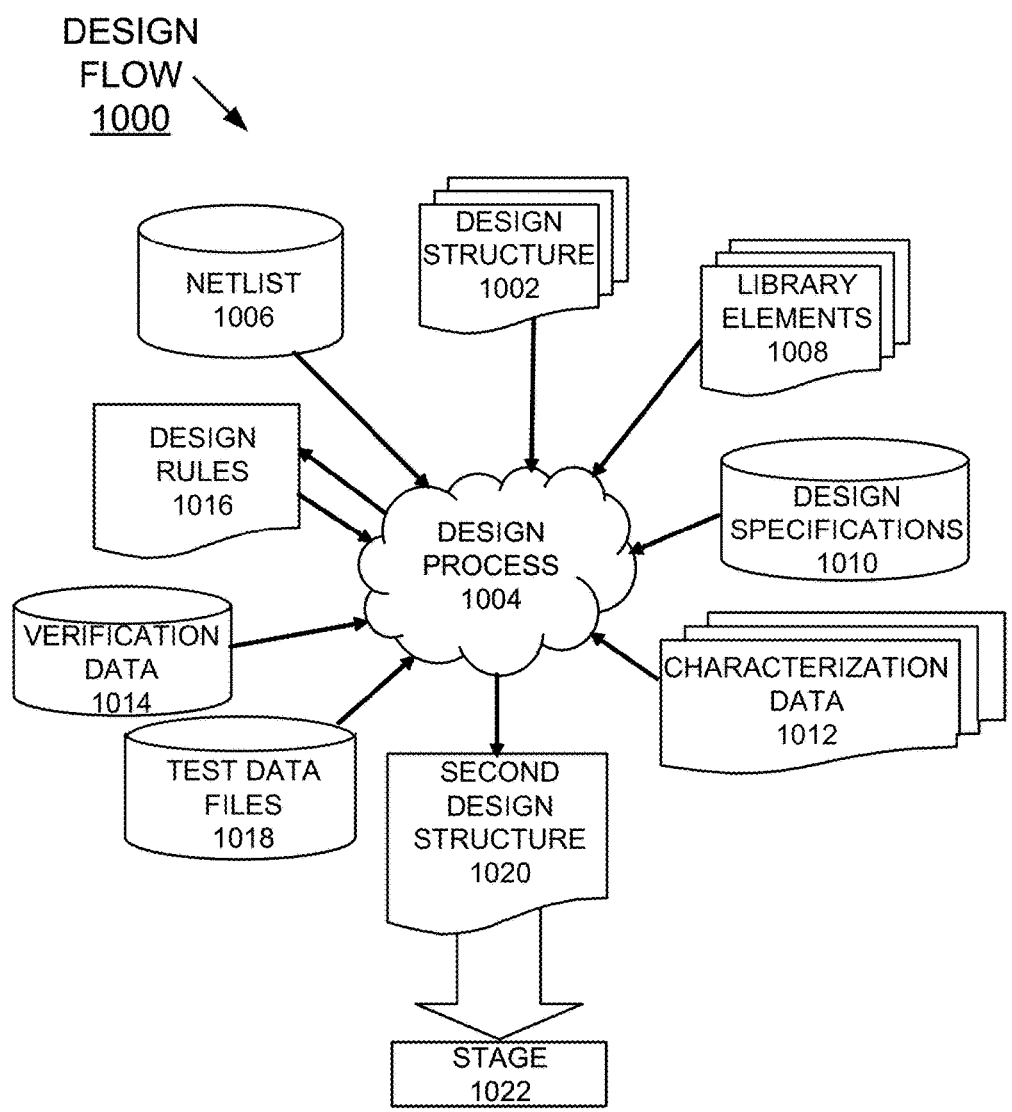
FIG. 10 is a flow diagram of a design process used in semiconductor design, manufacturing, and/or test.

FIG. 10 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1002 is preferably an input to a design process 1004 and may come from an IP provider, a core developer, or other design company or may be generated by the operator of the design flow, or from other sources. Design structure 1002 comprises circuits 100, 200 in the form of schematics or HDL, a hardware-description language, for example, Verilog, VHDL, C, and the like. Design structure 1002 may be contained on one or more machine readable medium. For example, design structure 1002 may be a text file or a graphical representation of circuit 200. Design process 1004 preferably synthesizes, or translates, circuits 100, 200 into a netlist 1006, where netlist 1006 is, for example, a list of wires, transistors, logic gates, control circuits, I/O, models, etc. that describes the connections to other elements and circuits in an integrated circuit design and recorded on at least one of machine readable medium. This may be an iterative process in which netlist 1006 is resynthesized one or more times depending on design specifications and parameters for the circuits.

Design process 1004 may include using a variety of inputs; for example, inputs from library elements 1008 which may house a set of commonly used elements, circuits, and devices, including models, layouts, and symbolic representations, for a given manufacturing technology, such as different technology nodes, design specifications 1010, characterization data 1012, verification data 1014, design rules 1016, and test data files 1018, which may include test patterns and other testing information. Design process 1004 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1004 without deviating from the scope and spirit of the invention. The design structure of the invention is not limited to any specific design flow.

Design process 1004 preferably translates an embodiment of the invention as shown in FIGS. 1, 2A, and 2B along with any additional integrated circuit design or data (if applicable), into a second design structure 1020. Design structure 1020 resides on a storage medium in a data format used for the exchange of layout data of integrated circuits, for example, information stored in a GDSII (GDS2), GL1, OASIS, or any other suitable format for storing such design structures. Design structure 1020 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, and 2B. Design structure 1020 may then proceed to a stage 1022 where, for example, design structure 1020 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing with over masking removal in an on product multiple input signature register plus (OPMISR+) test due to common Channel Mask Scan Registers (CMSRs) loading comprising:
   providing at least one OPMISR plus satellite, each OPMISR plus satellite including a multiple input signature register (MISR) for data collection and a plurality of associated scan channels;
   providing common Channel Mask Scan Registers (CMSR) logic with the multiple input signature register (MISR);
   loading unique CMSR data into at least one OPMISR plus satellite for implementing enhanced scan data testing; and
   using scan pausing to reduce the amount of CMSR scan load data by loading the unique CMSR data only when needed.

2. The method as recited in claim 1 includes a providing scan-in (0:31) broadcast mode input for providing test data selectively applied to a respective associated scan channel used for the OPMISR plus test.

3. The method as recited in claim 1 wherein loading unique CMSR data into at least one OPMISR plus satellite for implementing enhanced scan data testing includes inputting CMSR data for a set of scan sections, and checking for non-zero mask data.

4. The method as recited in claim 3 includes responsive to no CMSR data being non-zero, scanning zero into all CMSR scan sections in parallel.

5. The method as recited in claim 3 includes responsive to any scan section containing non-zero mask data, setting an index for all scan sections, and checking for any bit for any scan section in current index being non-zero.

6. The method as recited in claim 5 includes responsive to no CMSR data being non-zero, scanning zero into all CMSR scan sections in parallel and incrementing an index for all scan sections.

7. The method as recited in claim 5 includes responsive to CMSR data being non-zero, selecting a CMSR scan section that has non-zero CMSR data to scan in and selecting any other scan section that has the same data, scanning in one bit, and incrementing an index for the selected scan sections.

8. The method as recited in claim 5 includes checking if an end of any CMSR scan section has been reached.

9. The method as recited in claim 8 includes responsive to identifying reaching the end of any CMSR scan section, removing that scan section from a list that of scan sections to be selected for CMSR scans.

10. The method as recited in claim 8 includes responsive to identifying any CMSR scan section not reaching the end, checking if any bit in the current scan-in index for any CMSR scan sections is non-zero.

11. A circuit for implementing enhanced scan data testing with over masking removal in an on product multiple input signature register plus (OPMISR+) test due to common Channel Mask Scan Registers (CMSRs) loading comprising:
    at least one OPMISR plus satellite, each OPMISR plus satellite including a multiple input signature register (MISR) for data collection and a plurality of associated scan channels;
    common Channel Mask Scan Registers (CMSR) logic provided with the multiple input signature register (MISR);
    satellite selection decode for loading unique CMSR data into at least one OPMISR plus satellite for implementing enhanced scan data testing; and
    scan clock pausing for loading the unique CMSR data to a selected satellite only when needed, removing over masking of CMSR scan load data.

12. The circuit as recited in claim 11 includes a scan-in (0:31) broadcast mode input for providing test data selectively applied to a respective associated scan channel used for the OPMISR plus test.

13. The circuit as recited in claim 11 includes Channel Mask Enable (CME) signals coupled to said common Channel Mask Scan Registers (CMSR) logic.

14. The circuit as recited in claim 13 wherein said Channel Mask Enable (CME) signals decode to four states of: no masking, use mask bit 0, use mask bit 1, and mask all channels.

15. The circuit as recited in claim 13 includes masking applied as scan data is unloaded from said scan channel into the MISR.

16. The circuit as recited in claim 15 wherein said masking includes when a bit position in a scan channel is going to shift into the MISR, the global CME signal is set to a desired mask state.

17. The circuit as recited in claim 11 wherein said includes satellite selection decode allows one satellite, multiples satellites and all satellites to be selectively loaded at any step.

18. The circuit as recited in claim 17 includes satellites not selected to be paused.

19. The circuit as recited in claim 11 wherein said satellite selection decode for loading unique CMSR data into at least one OPMISR plus satellite for implementing enhanced scan data testing includes inputting CMSR data into for a set of scan sections, and checking for non-zero mask data.

20. The circuit as recited in claim 19 includes responsive to any scan section containing non-zero mask data, setting an index for all scan sections, and checking for any bit for any scan section in current index being non-zero.

\* \* \* \* \*